(12) United States Patent
Trovati et al.

(10) Patent No.: US 11,031,505 B2
(45) Date of Patent: Jun. 8, 2021

(54) TRANSISTOR AND ITS MANUFACTURING PROCESS

(71) Applicant: X-FAB FRANCE, Corbeil Essonnes (FR)

(72) Inventors: Philippe Trovati, Lambesc (FR); Nicolas Pons, Draveil (FR); Pascal Costaganna, Chailly en Biere (FR); Francis Domart, Mennecy (FR)

(73) Assignee: X-FAB FRANCE, Corbeil Essonnes (FR)

( * ) Notice: Subject to any disclaimer, the term of this patent is extended or adjusted under 35 U.S.C. 154(b) by 0 days.

(21) Appl. No.: 16/232,826

(22) Filed: Dec. 26, 2018

(65) Prior Publication Data
US 2019/0245097 A1    Aug. 8, 2019

(30) Foreign Application Priority Data
Dec. 29, 2017    (FR) ...................................... 1763408

(51) Int. Cl.
*H01L 29/786*  (2006.01)
*H01L 29/423*  (2006.01)
*H01L 21/762*  (2006.01)
*H01L 29/16*   (2006.01)
*H01L 29/66*   (2006.01)

(52) U.S. Cl.
CPC .. *H01L 29/78654* (2013.01); *H01L 21/76243* (2013.01); *H01L 29/16* (2013.01); *H01L 29/4238* (2013.01); *H01L 29/42384* (2013.01); *H01L 29/66772* (2013.01)

(58) Field of Classification Search
None
See application file for complete search history.

(56) References Cited

U.S. PATENT DOCUMENTS

| | | | | |
|---|---|---|---|---|
| 6,307,237 | B1* | 10/2001 | Erstad | H01L 27/1203 257/353 |
| 7,011,980 | B1* | 3/2006 | Na | H01L 22/34 257/48 |
| 9,421,087 | B1* | 8/2016 | Hekmatshoartabari | A61F 2/105 |
| 2002/0048972 | A1* | 4/2002 | Yamaguchi | H01L 29/41733 257/734 |
| 2003/0113959 | A1* | 6/2003 | Min | H01L 29/7841 438/151 |
| 2003/0201494 | A1* | 10/2003 | Maeda | H01L 21/84 257/347 |
| 2004/0075141 | A1* | 4/2004 | Maeda | H01L 29/1087 257/347 |
| 2005/0023608 | A1* | 2/2005 | Chan | H01L 29/66772 257/347 |

(Continued)

*Primary Examiner* — Khaja Ahmad
(74) *Attorney, Agent, or Firm* — Hauptman Ham, LLP

(57) ABSTRACT

A transistor carried by a substrate comprising an active layer, the transistor comprising: at least one source area and at least one drain area; at least one electrical contact area; at least one conduction channel; at least one gate; wherein the gate comprises: a longitudinal portion; a transverse portion extending on either side of a portion of the active layer and comprising: at least a first portion extending beyond a portion of a first side of the portion of the active layer on a first extension dimension I2; at least a second portion extending beyond a portion of a second side of the portion of the active layer on a second extension dimension I3; and in that: I2>I3 with I3≠0.

17 Claims, 3 Drawing Sheets

(56) References Cited

U.S. PATENT DOCUMENTS

| | | | |
|---|---|---|---|
| 2008/0076196 A1* | 3/2008 | Yamaguchi | H01L 22/14 438/17 |
| 2014/0332887 A1* | 11/2014 | Zhang | H01L 29/66477 257/347 |
| 2016/0071758 A1* | 3/2016 | See | H01L 29/0649 257/347 |
| 2017/0194490 A1* | 7/2017 | Li | H01L 29/0692 |

\* cited by examiner

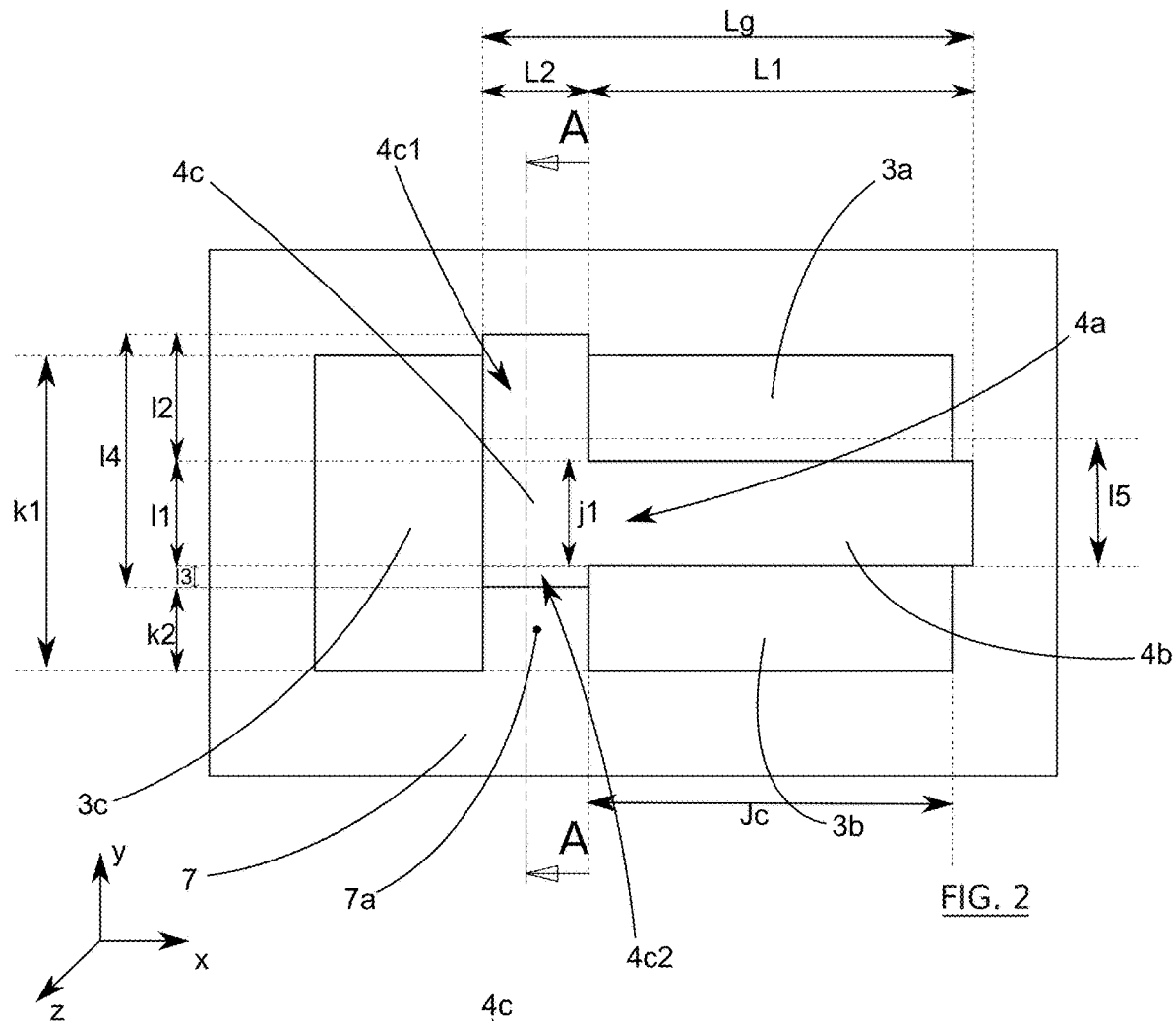
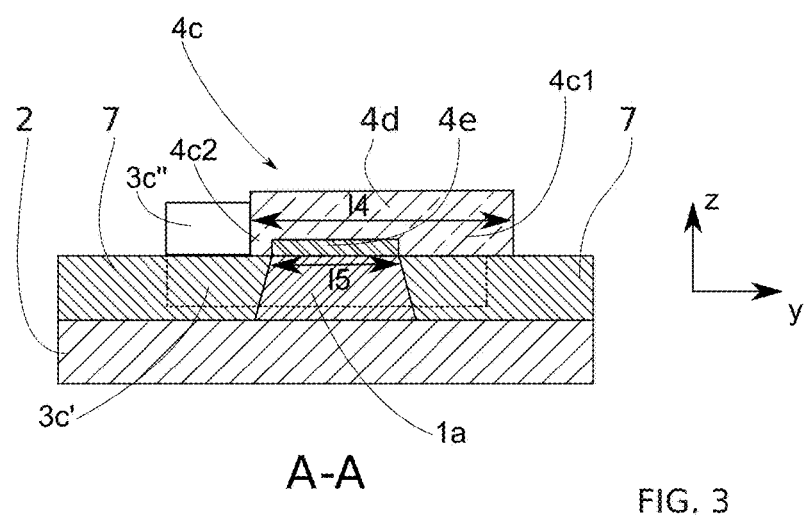

A-A

TRANSISTOR AND ITS MANUFACTURING PROCESS

TECHNICAL FIELD OF THE INVENTION

The present invention relates to the field of microelectronics and nanoelectronics and more particularly the field of transistors. It will find a particularly advantageous application in partially depleted transistors.

STATE OF THE ART

In the field of integrated circuits formed from substrates made of semiconductor-on-insulator type, designated by their acronym SOI, there are different types of transistors: so-called partially depleted transistors designated by their acronym PDSOI, and so-called fully depleted transistors designated by their acronym FDSOI.

An elaborated SOI substrate is characterized by the presence of an active layer formed by a thin crystalline semiconductor surface layer, monocrystalline silicon for example, resting on a continuous insulating oxide layer, for example silicon oxide, known as buried oxide or BOX. The solidity and mechanical rigidity of the assembly are ensured by a support layer or substrate on which the BOX rests and which constitutes the body of the SOI substrate, often referred to as "bulk" to indicate that the starting substrate is very generally made of a solid semiconductor material, silicon for example. This structure offers many advantages for the production of MOS transistors, which stands for "Metal-Oxide-Semiconductor". In particular, it enables a drastic reduction in parasitic capacities due to the presence of the continuous insulating layer.

FIG. 1 shows a PDSOI transistor according to the prior art. This transistor is formed from a SOI substrate comprising successively a thick layer of silicon 1 a BOX 2, an active layer made of a semiconductor material. The transistor includes a source area 3a, a drain area 3b arranged on either side of a conduction channel 6. The source 3a and drain 3b areas and the conduction channel 6 being, in this example, formed in the active layer. The transistor also includes a gate stack 4, called gate for brevity, which surmounts the active layer and the sides of which are covered with two spacers 5a and 5b.

It should be noted that PDSOI transistors, as shown in FIG. 1 for example, generally have a portion of the conduction channel with a so-called "floating" electrical potential in the sense that a charge can be formed there and thus induce a reduction in transistor performance. To overcome this problem, many solutions have been proposed and are generally based on the use of an electrical contact area corresponding to an extension of the conduction channel connected to one or the other of the source and drain areas of the transistor, in order to determine its electrical potential. Many solutions have been proposed to this end. However, none of them enables a real improvement both in terms of performance and compactness for the manufacture of electronic devices including PDSOI transistors. Indeed, the proposed solutions, when they are satisfactory in terms of performance, generally lead to unsatisfactory compactness or excessive production costs.

There is therefore a need to address the problems caused by the floating potential, while maintaining limited production costs and/or space requirement.

This invention aims to propose a solution to meet this need.

SUMMARY OF THE INVENTION

The present invention relates to a transistor carried by at least one substrate comprising at least one active layer based on at least one semiconductor material, the transistor comprising:
a) at least one source area and at least one drain area, preferably each doped with a first polarity, preferably taken from a polarity N or P;
b) at least one electrical contact area preferably doped according to the first polarity;
c) at least one conduction channel:
  i) between the source area and the drain area, preferably doped with a second polarity different from the first polarity;
  ii) extending from said source area to said drain area in a transverse dimension j1 and extending in a longitudinal dimension Jc, preferably from each of the source and drain areas to the electrical contact area;
d) at least one gate, completely surmounting said conduction channel.

Said gate includes a longitudinal portion extending longitudinally from at least each of the source and drain areas, above the conduction channel, and at least to the electrical contact area.

Said gate also includes a transverse portion located between the electrical contact area and each of the source and drain areas. This transverse portion extends transversely on either side of a portion of the active layer, over a transverse dimension I4. The transverse portion includes:
(a) at least a first portion extending transversely beyond a portion of a first side of said portion of the active layer on a first extension dimension I2, preferably, the first portion being shaped to be disposed between a portion of the electrical contact area 3c and a first area taken from the source area or the drain area so as to avoid any electrical connection between the electrical contact area and said first area;
(b) at least a second portion extending transversely beyond a portion of a second side of said portion of the active layer, opposite said first side, on a second extension dimension I3;

Advantageously I2>I3 with I3≠0, and, preferably, the electrical contact area is located at a distance from the source area and the drain area so as to avoid any electrical connection between the electrical contact area and a second area being the other area taken from the source area or the drain area which is disposed opposite the electrical contact area.

The present invention thus makes it possible to have a transistor, for example of the PDSOI type, with an electrical contact area, commonly called "body contact", in order to control the potential of a portion of the conduction channel in order to improve the transistor's performance.

Moreover, the present invention makes it possible, thanks to the shape of the gate, defining a hammer shape, to optimize the compactness of a plurality of transistors arranged on the same substrate.

The present invention, through the asymmetry of the gate, makes it possible for the shape of the transistor to be adapted to the user's needs. Indeed, an electrical connection may or may not be provided between the electrical contact area and one of the source and drain areas. Thus this type of shape makes it possible to form a MOSFET transistor the source, drain or other area of which can be electrically connected or not to the conduction channel in order to control its electrical potential.

In particular, the present invention allows a significant gain in terms of gate density per square millimetre compared to solutions wherein the gate has a "T" shape and not a hammer shape.

Thus the present invention offers an effective solution to solve the problem of floating electrical potential while keeping the cost and size limited.

In addition, this invention enables a different electrical potential to be applied to the electrical contact area compared to the source and drain areas. This electrical contact area is in electrical conduction with the conduction channel.

Advantageously, the electrical potential of the electrical contact area can be independent of that of the source area and that of the drain area.

Thus, the absence of electrical conduction between the electrical contact area and the source and drain areas gives this invention an additional degree of freedom in the voltage control of the thus formed transistor. This voltage control improves the transistor's performance. Indeed, the adjustment of the electrical potential of the electrical contact area reduces the leakage current of the transistor.

Another subject of this invention relates to a microelectronic device comprising a plurality of transistors according to the invention. Microelectronic device means any type of device made with microelectronic means. In addition to purely electronic devices, these devices include micromechanical or electromechanical devices (MEMS, NEMS, etc.) and optical or optoelectronic devices (MOEMS, etc.).

The present invention also relates to a method for manufacturing a transistor according to the present invention comprising at least one source area, at least one drain area and at least one electrical contact area, preferably each doped according to a first polarity and at least one conduction channel preferably doped according to a second polarity, said method comprising at least the following steps:
a) Supplying a substrate comprising at least one active layer;
b) Defining a reception area intended to accommodate at least one transistor via the formation of at least one insulating trench;
c) Forming said conduction channel, preferably by doping according to the second polarity different from the first polarity, at a part of the reception area so that said conduction channel has a longitudinal dimension Jc and a transverse dimension j1;
d) Forming a gate, this step of forming a gate comprising at least the following steps:
  i) Forming an oxide layer so as to cover, preferably completely, the conduction channel;
  ii) Forming a polycrystalline layer above said oxide layer, said polycrystalline layer having a geometric structure comprising at least:
    (1) a longitudinal portion extending longitudinally over the conduction channel;
    (2) a transverse portion extending transversely on either side of a portion of the active layer over a transverse dimension I4 and the transverse portion comprising:
      (a) at least a first portion extending transversely beyond a portion of a first side of said portion of the active layer on a first extension dimension I2;
      (b) at least a second portion extending transversely beyond a portion of a second side, opposite said first side, of said portion of the active layer on a second extension dimension I3 so that I3<I2 and I3≠0;
e) Forming a first area taken from a source area and a drain area, preferably by doping according to the first polarity, preferably taken from a polarity N or P, at a first side of the longitudinal portion of the gate;
f) Forming a second area taken from a source area and a drain area, preferably by doping according to the first polarity, at a second side of the longitudinal portion of the gate, said second side of the longitudinal portion being opposed to said first side of the longitudinal portion;
g) Forming an electrical contact area, preferably by doping according to the first polarity, this electrical contact area being arranged so that the transverse portion of the gate is located between said electrical contact area and the first and second areas, preferably so that the electrical contact area 3c is located at a distance from the source area 3a and the drain area 3b and so as to avoid any electrical connection between the electrical contact area 3c and the source area 3a and the drain area 3b.

BRIEF DESCRIPTION OF THE FIGURES

The purposes, objects, characteristics and advantages of the invention will be best illustrated by the detailed description of one embodiment thereof, which is illustrated by the following appended drawings wherein:

FIG. 2 illustrates a top view of a transistor according to one embodiment of this invention including a gate with a hammer shape.

FIG. 3 shows a view according to section A-A of the transistor as shown in FIG. 1.

Figure 1:
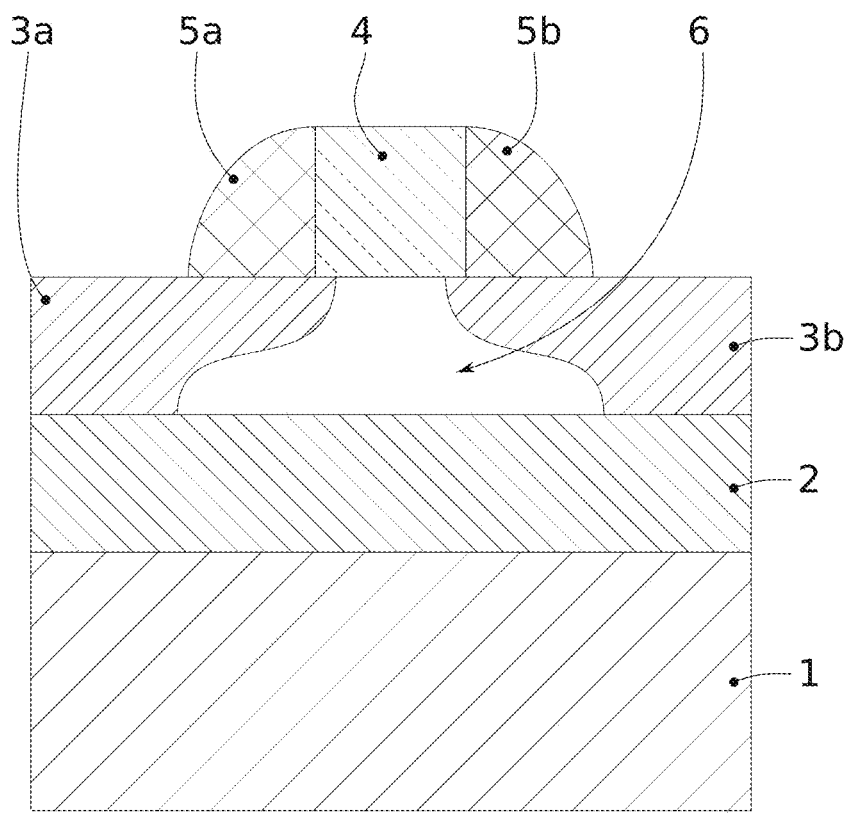
FIG. 1 shows a PDSOI transistor according to the prior art.

The attached drawings are given as examples and are not restrictive to the invention. These drawings are schematic representations and are not necessarily on the scale of a practical application. In particular, the transverse and longitudinal lengths and relative thicknesses of the different layers are not representative of reality.

DETAILED DESCRIPTION OF THE INVENTION

A PDSOI transistor or more generally a PDSOI device is a device built in an area of the active layer the thickness of which is greater than the maximum depletion layer $W_{d\_max}$ (excluding polarization).

FDSOI transistor or more generally FDSOI device means a device built in an area of the active layer the thickness of which is lower than the maximum depletion layer $W_{d\_max}$ (excluding polarization).

The thickness of this maximum depletion layer $W_{d\_max}$ is given by the equation:

$$W_{d\_max}=(2\varepsilon_{Si}\varepsilon_0\varphi_F/qN_A)^{1/2}$$

With:
$\varepsilon_{Si}$: the relative dielectric constant of silicon;
$\varepsilon_0$: the absolute dielectric constant of the vacuum;

$\varphi_F = (kT/q) \ln(N_A/N_i)$;

k: the Boltzmann constant;

T: temperature;

$n_i$: the intrinsic concentration of silicon carriers;

q: the elementary electrical charge;

$N_A$: the concentration of impurities.

This, at room temperature (300 K), gives ($\varphi_F$=0.0259 $\ln(N_A/1.5\times10^{10})$.

It is specified that in the context of this invention, the terms "slice", "substrate" or "chip" or their equivalents are defined as a device that advantageously includes one or more layer(s) of semiconductors and is configured to receive the formation of semiconductor structures of the transistor type for example.

It is specified that in the context of this invention, the term "SOI substrate", or its equivalents, is defined as a substrate characterized by the presence of a surface layer of monocrystalline semiconductor, monocrystalline silicon for example, resting on a continuous insulating layer of oxide, for example silicon oxide, known as buried oxide or BOX acronym of the English "buried oxide layer". The solidity and mechanical rigidity of the assembly are ensured by a support layer made of silicon, for example.

It is specified that, in the context of this invention, the terms "on", "overcomes" or "underlying" or their equivalent do not necessarily mean "in contact with". Thus, for example, the deposition of a first layer on a second layer does not necessarily mean that the two layers are in direct contact with each other, but it does mean that the first layer at least partially covers the second layer by being either in direct contact with it or separated from it by another layer or element.

In the following description, thicknesses are generally measured in directions perpendicular to the plane of the underside of the support substrate on which the active layer is placed. Thus, thicknesses are generally taken in the z direction of the orthogonal mark in FIGS. 2 to 5.

The term "step" does not necessarily mean that the actions carried out during one step are simultaneous or immediately successive. Some actions in a first step may be followed by actions related to a different step, and other actions in the first step may be repeated afterwards. Thus, the term step does not necessarily mean unitary and inseparable actions in time and in the sequence of method phases.

"structure" of a material means the spatial distribution of its elementary constituents from a crystallographic point of view. Thus, two layers of the same material may be of the same nature, but have different crystalline structures.

The "nature" of a material refers to its chemical composition and/or crystal structure. Thus two layers can be of the same chemical composition, but of a different nature from a crystallographic point of view.

A "transverse" dimension is defined as any dimension measured in a dimension parallel to the length of the conduction channel, i.e. the path of the charge carriers from the source area to the drain area.

A "longitudinal" dimension is defined as any dimension measured along a dimension perpendicular to the transverse dimension of the conduction channel.

"Hammer" means a geometric shape comprising a longitudinal portion, called a "handle", extending longitudinally and a transverse portion, called a "head", extending transversely and preferably, but not necessarily, located at one end of the longitudinal portion. It is specified that the transverse portion extends on either side of the longitudinal portion over different and non-zero extension dimensions so as to have an asymmetry forming a "hammer" and not a "T" or a "L". Thus, the hammer head has a crossbar formed by two branches or transverse portions extending on either side of the handle, the length of one of the two transverse portions being greater than the length of the other transverse portion.

In this description, the notion of source area and drain area depends on the electrical installation associated with these areas. Thus, in this description, the so-called source area and the so-called drain area are interchangeable. Consequently, in all the embodiments of this invention, the area 3a, referenced in the figures that will be described below, may be any one of the source area and the drain area and the area 3b may be the other one of the source area and the drain area. We can have the source area 3a and the drain area 3b or have the source area 3b and the drain area 3a.

When an element is indicated as being located just above another element, it means that both elements are located on the same line perpendicular to the main plane of the substrate, i.e. on the same line oriented vertically in the figures.

In this patent application, a doping noted P includes all doping by positive charge carriers (holes) regardless of the content of the doping. Thus, a P doping includes P+ doping contents and P doping contents lower than P+ type doping. Similarly, a doping noted N includes all doping by negative charge carriers regardless of the content of the doping. Thus, an N doping includes the N+ doping contents and the N doping contents lower than the N+ type doping.

Conventionally, a doping noted P+ means that it is a P-type doping (doping with positive charges) and the doping species content of which is greater than or equal to 1 atom of the doping species for less than 500 atoms of the semiconductor and preferably for less than 10 to 100 atoms of the material forming the semiconductor layer. Similarly, N+ doping means that it is an N-type doping (doping with negative charges) and the doping species content of which is greater than or equal to 1 atom of the doping species for less than 500 atoms of the semiconductor and preferably for less than 10 to 100 atoms of the material forming the semiconductor layer.

Before starting a detailed review of the embodiments of the invention, the following are optional characteristics that may be used in combination or alternatively:

- Advantageously, I2 is greater than 1.2 times I3, preferably 1.5 times I3.
- Advantageously, I3 is different from zero while being as small as possible within the tolerance of the manufacturing method, preferably to the alignment tolerance of the masks used in the manufacturing method. This dimension I3 greater than 0 avoids any electrical connection between the electrical contact area and the source or drain area that is located opposite it.
- Advantageously, I3 is at least equal to 60 nm for I1 equal to 130 nm.
- Advantageously, I3 is roughly equal to half I1.
- Advantageously, the present invention comprises at least one electrical connection between at least a portion of the electrical contact area and one of the source area and the drain area located at said second side of the conduction channel.
- This makes it possible to create an electrical connection between the electrical contact area and one of the source area and the drain area and to control the electrical potential of at least part of the conduction channel by putting it at the electrical potential of one of the source area and the drain area.
- Advantageously, said transverse portion is so configured that an area of the substrate is not covered by said gate and is located between said electrical contact area and the at least one area from the source area and the drain area, said uncoated area having a transverse dimension k2.

This makes it easy to achieve electrical contact between the electrical contact area and said area from the source area and the drain area, for example by depositing an electrically conductive layer between the electrical contact area and said area from the source area and the drain area.

Advantageously, the electrical connection has a transverse dimension less than or equal to k2.

Advantageously, the electrical connection has a longitudinal dimension L8 greater than or equal to a longitudinal dimension L2 of the transverse portion of the gate.

Advantageously, said longitudinal portion of the gate has a transverse dimension I1 and the ratio I1/j1 is greater than 1, preferably greater than 1.5 and advantageously greater than 2.

Advantageously, the transverse portion of the gate has a transverse dimension I4 and the ratio I4/I1 is greater than 2, preferably greater than 3 and advantageously greater than 5.

Advantageously, the transverse portion of the gate has a transverse dimension I4 and the ratio I4/j1 is greater than 2, preferably greater than 3 and advantageously greater than 5.

Advantageously, the ratio I4/d1 is greater than 1, preferably greater than 10 and advantageously greater than 100.

Advantageously, the ratio I2/I3 is greater than 2, preferably greater than 3 and advantageously greater than 5.

Advantageously, the ratio I2/I3 is greater than 1, preferably greater than 10 and advantageously greater than 100.

Advantageously, the ratio I2/k2 is greater than 1, preferably greater than 2 and advantageously greater than 5.

Advantageously, the conduction channel has a longitudinal dimension Jc, and the gate has a longitudinal dimension Lg, the ratio Lg/Jc being greater than or equal to 1, preferably greater than 2 and advantageously greater than 5.

Advantageously, the gate has a thickness dimension between 1 nm and 100 nm, preferably between 1.5 nm and 25 nm and advantageously between 2 nm and 15 nm.

Advantageously, said portion of the active layer below the transverse portion of the gate has a transverse dimension I5, I5 being smaller than I4.

Advantageously, said portion of the active layer located below the transverse portion of the gate has a transverse dimension I5, I5 being greater than j1.

Advantageously, said portion of the active layer below the transverse portion of the gate has a transverse dimension I5, I5 being smaller than I4 and larger than j1.

This improves the electrical conduction between the electrical contact area and the conduction channel, preferably through said portion of the active layer.

Advantageously, the gate comprises at least one oxide layer overlying said portion of the active layer located below the transverse portion of the gate and at least one polycrystalline layer overlying and surrounding said oxide layer.

Advantageously, the gate comprises at least one oxide layer overlying at least the conduction channel and at least one polycrystalline layer overlying and partially surrounding at least said oxide layer.

Advantageously, the oxide layer comprises at least one of the materials taken from: silicon oxide, material with high dielectric permittivity, nitride oxide, a material with a low dielectric constant.

Advantageously, the polycrystalline layer includes silicon

Advantageously, the electrical connection includes at least one of the materials taken from: copper, aluminium, an electrically conductive material.

Advantageously, the present invention comprises forming an electrical connection between the electrical contact area and one of the source area and the drain area.

Advantageously, the present invention comprises forming at least one spacer at at least a portion of the perimeter of the gate.

Advantageously, an insulating trench is placed between the electrical contact area and at least one of the source area and/or the drain area.

This makes it possible for the electrical contact area to be electrically isolated from at least one of the source area and/or the drain area.

Advantageously, the electrical contact area is electrically isolated from at least one of the source area and/or the drain area by at least one insulating trench. This makes it possible for the electrical contact area to be electrically isolated from at least one of the source area and/or the drain area.

Advantageously, forming the insulating trench comprises at least forming an insulating trench intended to be placed between the electrical contact area and at least one of the source area and/or the drain area.

This makes it possible for the electrical contact area to be electrically isolated from at least one of the source area and/or the drain area.

One non restrictive embodiment of the present invention will now be described while referring to FIGS. 2 to 5.

FIG. 2 shows a transistor, for example of the MOSFET type, according to a top view and a first embodiment of the present invention.

This transistor, thus formed, has a source area 3a, a drain area 3b which can for example both be doped with a first polarity and a conduction channel 6 not shown which can for example be doped with a second polarity. The conduction channel 6 is located between the source area 3a and the drain area 3b. It has a transverse dimension j1 separating the source 3a and drain 3b areas. This dimension j1 thus corresponds to the length of the channel since it corresponds to the distance that the load carriers must travel between the source area 3a and the drain area 3b. In FIGS. 2 to 5, this transverse dimension j1 extends along the y-axis.

The conduction channel 6 also has a longitudinal dimension Jc, taken perpendicular to the transverse direction j1. In FIGS. 2 to 5, this longitudinal dimension Jc extends along the x-axis.

According to the embodiment, Jc may advantageously be equal to the longitudinal dimension of the source area 3a and/or the drain area 3b. According to this embodiment, the channel extends between the source area 3a and the drain area 3b only. Thus, the channel, along the x-axis, extends opposite the source 3a and drain 3b areas only.

Figure 5:
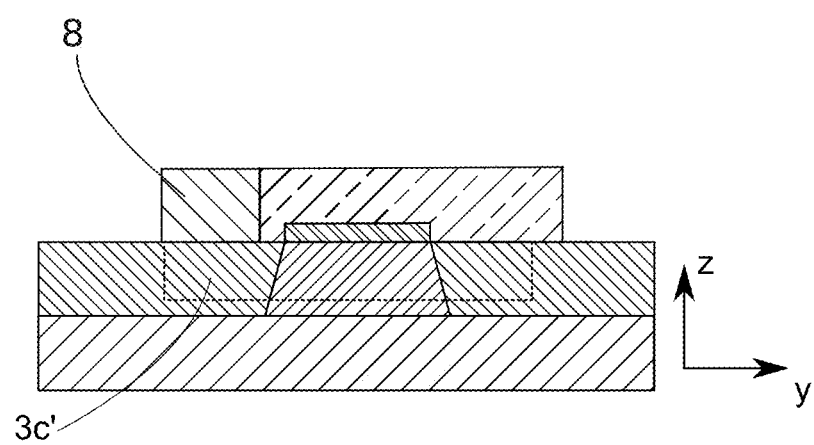
FIG. 5 shows a view according to section A-A of the transistor as shown in FIG. 4.

According to another embodiment, Jc may be larger than the longitudinal dimension of the source area 3a and/or the drain area 3b, as shown in FIGS. 3 and 5.

This figure also illustrates an electrical contact area 3c with a transverse dimension k1, preferably equal to or greater than the sum of the transverse dimensions of the source 3a, drain 3b areas and of the conduction channel 6. It should be noted that this electrical contact area 3c may have at least two flanks located opposite the source area 3a and the drain area 3b respectively. The electrical contact area 3c is located at a distance from the source area 3a and the drain area 3b. In particular, along the x-axis, there is no contact between the contact area 3c and one of the source 3a or drain 3b areas.

Typically, the source 3a and drain 3b areas are formed in a doped semiconductor material. Similarly, the contact area 3c is preferably made of doped semiconductor material.

According to one embodiment, the source 3a and drain 3b areas can only be formed in the active layer, as shown in the example in FIG. 1 and FIG. 3. Alternatively, the source 3a and drain 3b areas can be totally or partially formed outside the active layer. The invention thus extends to the embodiments wherein the source 3a and drain 3b areas are raised, i.e. they extend at least partially above the upper surface of the active layer. This alternative embodiment is particularly suitable for SOI substrates with a relatively thin active layer, for example in the case of FDSOI transistors wherein the thickness of the Si layer is generally less than or equal to 70 nm.

According to one embodiment, the electrical contact area 3c can only be formed in the active layer, as shown in the example in FIG. 3 through element 3c'. In this figure, area 3c' is shown as a dotted line because it is not in the plane of section A-A.

Alternatively, the electrical contact area 3c can be totally or partially formed outside the active layer, as shown in the example in FIG. 3 through the element 3c". The invention thus extends to the embodiments wherein the electrical contact area 3c is raised, i.e. it extends at least partially above the upper surface of the active layer.

According to a preferred embodiment, this transistor, in particular a portion of the active layer 1 defining the reception area, can be surrounded by one or more insulating trench(es) 7, otherwise known as "Shallow Trench Isolation" (STI). According to this preferred embodiment, a portion of the gate may or may not be placed above a portion of the insulating trench(es) 7.

This transistor also has a gate 4. This gate 4 is arranged at the top of, and above the conduction channel 6, preferably so as to cover the entire conduction channel 6. Preferably, this gate 6 is configured to overflow on either side of the conduction channel 6.

In FIGS. 2, 3, 4 and 5 a portion of the insulating trench 7 surrounding the active layer 1 is located under a portion of the gate 4 of the transistor. According to one embodiment of this invention, at least a portion of the gate 4 is arranged between at least a portion of the electrical contact area 3c and at least a part of the source area 3a and/or the drain area 3b.

According to one embodiment, at least a first portion 4c1 of the gate 4 is arranged between the electrical contact area 3c and the source area 3a and at least a second portion 4c2 of the gate 4c is arranged between the electrical contact area 3c and the drain area 3b.

According to another embodiment not illustrated, at least a first portion 4c1 of the gate 4 is arranged between the electrical contact area 3c and the drain area 3b and at least a second portion 4c2 of the gate 4c is arranged between the electrical contact area 3c and the source area 3a.

This allows the electrical contact area 3c to be electrically isolated from the source area 3a and the drain area 3b.

Preferably, the gate 4 is arranged in contact with the conduction channel 6.

According to one embodiment, a portion of the gate 4 is placed in contact with the insulating trench 7.

For the sake of brevity and clarity, in the following description the term gate will refer to a single-layer gate or a gate formed by a plurality of layers forming a gate stack. In the latter case, the gate stack includes in particular:
 a gate pattern usually made of doped silicon or metal,
 a metal layer between the gate pattern and the active layer,
 an electrically insulating layer called gate oxide 4e located between the active layer and the polycrystalline silicon gate pattern.

Optionally, the gate stack can also include a so-called "high-k" dielectric layer, i.e. made of a high permittivity material. When present, this dielectric layer is located between the gate oxide and the metal gate.

In FIG. 3, for reasons of clarity and conciseness, the gate, whether it is formed of a single layer or a plurality of layers forming a gate stack, is represented by a layer referenced 4a of polycrystalline type and by an insulating layer 4e.

The gate stack 4 as well as the source 3a and drain 3b areas are each topped by a contact recovery layer. These recovered contacts are located respectively on the top of the gate stack and the top of the source 3a and drain 3b areas to allow electrical connection with other portions of the circuit. The recovered contact are formed in a conductive material. Typically, they are produced by siliconizing.

According to one embodiment, the first formed gate 4 is intended to be stored in the final transistor. This embodiment is usually referred to as a "gate first" method.

According to an alternative embodiment not illustrated, the gates are sacrificial patterns that are intended to be removed after the other elements of the structure, such as gate spacers 5a and 5b, have been made, and then replaced by other gates that preferably form stacks such as those described above. This type of method wherein the first gates are described sacrificially is usually referred to as a "gate last" method.

Thus, the invention covers the embodiments wherein the final gate or gate stack is realized from the beginning as well as the embodiments wherein the gate or gate stack is realized after the formation of a sacrificial gate pattern. This allows the present invention to apply in the case where one or more gate(s) formed on the same substrate must have different natures or stacks of different layers.

In the following description, which illustrates a gate first type embodiment with reference to the figures, "stacking" and "gate" will be used as well as "pattern".

Advantageously, the gate 4 has a "hammer" shape 4a according to its extension in a plane parallel to the main plane of the substrate extension. This hammer 4a has a longitudinal dimension Lg and a transverse dimension l4.

Thus, the gate 4a has a longitudinal portion 4b (extending along the x-axis), subsequently called the "handle" of the hammer 4a, and a transverse portion 4c (extending along the y-axis), subsequently called the "head" of the hammer 4a.

The handle 4b of the hammer 4a has a longitudinal dimension L1 extending over at least part of the conduction channel 6, preferably from the electrical contact zone 3c to at least each of the source 3a and drain 3b areas. The handle 4b of the hammer 4a also has a transverse dimension l1, preferably at least equal to the transverse dimension j1 of the conduction channel 6; preferably, depending on its longitudinal dimension L1, the handle 4b exceeds the source 3a and drain 3b areas as shown in FIG. 2 in order to ensure that the conduction channel 6 is protected by the gate during the various steps of transistor manufacture, for example during ion implantation.

The head 4c of the hammer 4a has a transverse dimension I4 extending on either side of a portion of the active layer 1a between the electrical contact area 3c and the source area 3a and at least partially between the electrical contact area 3c and the drain area 3b. This portion of the active layer 1a has a transverse dimension I5. Particularly advantageously, I5 is smaller than I4 so that the transverse portion 4c of the gate 4 protects said portion of the active layer 1a during the various steps of transistor manufacture, for example during ion implantations. This also provides electrical isolation of the electrical contact area 3c from the source area 3a and the drain area 3b.

Preferably, I5 is greater than j1, this improves the electrical conduction between the electrical contact area 3c and the conduction channel 6.

According to one embodiment, said portion of the active layer 1a can partially or integrally belong to the conduction channel 6.

The head 4c of the hammer 4a also has a longitudinal dimension L2 extending from the source 3a and drain 3b areas to at least the electrical contact area 3c.

Particularly advantageously, the head 4c of the hammer 4a, i.e. the transverse portion of the gate 4, comprises at least a first portion 4c1 and a second portion 4c2, each extending along the y-axis. The first portion 4c1 extends on a first side of said portion of the active layer 1a along a first dimension I2. Considering a first longitudinal line extending along the x-axis and located just above a first flank of the handle 4b of the hammer 4a, the handle 4b of the hammer 4a and this first side of said portion of the active layer 1a are located on either side of this first longitudinal line.

The second portion 4c2 extends from a second side of the portion of the active layer 1a along a second dimension I3. Considering a second longitudinal line extending along the x-axis and located just above a second flank of the handle 4b of the hammer 4a, the handle 4b of the hammer 4a and this second side of said portion of the active layer 1a are located on either side of this second longitudinal line.

It should be noted that, without limitation, the first portion 4c1 of the head 4c of the hammer 4a is so configured as to be arranged between a portion of the electrical contact area 3c and the source area 3a so that the electrical contact area 3c does not face the source area 3a in a direction parallel to the x-axis. Advantageously, the first portion 4c1 of the head 4c of the hammer 4a is so configured as to be arranged between a portion of the electrical contact area 3c and the source area 3a so that the electrical contact area 3c is not in electrical contact with the source area 3a.

The second portion 4c2 of the head 4c of the hammer 4a can be so configured as to be arranged between a portion of the electrical contact area 3c and the drain area 3b so that the electrical contact area 3c remains, at least in part, opposite the drain area 3b in a direction parallel to the x-axis. This opposite portion, also called exposed portion, extends over a transverse dimension k2. Advantageously, the second portion 4c2 of the head 4c of the hammer 4a is so configured as to be arranged between a portion of the electrical contact area 3c and the drain area 3b so that the electrical contact area 3c is not in electrical contact with the drain area 3b.

Advantageously, an insulating trench 7a is placed between a portion of the electrical contact area 3c and the drain area 3b so that the electrical contact area 3c is not in electrical contact with the drain area 3b.

Preferably, the electrical contact area 3c is electrically isolated from the drain area 3b by at least the second portion 4c2 of the head 4c of the hammer 4a and by at least one insulating trench 7a, the insulating trench 7a being preferably a portion of the insulating trench 7.

According to a preferred embodiment, the insulating trench 7 includes the portion of the insulating trench 7a located between the electrical contact area 3c and the source 3a and/or drain 3b area.

According to a preferred embodiment, at least a portion 7a of a dielectric material is arranged between the electrical contact area 3c and at least one of the source area 3a and/or the drain area 3b along the x-axis, i.e. in the main direction of extension of the handle 4b of the hammer 4a. This makes it possible to electrically isolate the electrical contact area from at least one of the source area 3a and/or the drain area 3b.

Advantageously, the electrical contact area 3c and the drain area 3b are separated along the x-axis by at least one dielectric area 7a so that they are electrically isolated from each other.

Thus, in a particularly advantageous way 33 is different from I2, otherwise the gate would have a "T" shape. As indicated above, compared to a gate with a "T" shape, the invention has the advantage of significantly increasing the integration density.

Advantageously, I3 is lower than I2.

Preferably, I3 is different from 0, otherwise the gate would have an "L" shape. Compared to a gate with an "L" shape, the invention has the advantage of dissociating the electrical potential of the electrical contact area 3c from the electrical potentials of the source 3a and drain 3b areas. This then allows a control of the electrical potential of the electrical contact area 3c independent of the control of the electrical potential applied to the source 3a and drain 3b areas. Since the electrical contact area 3c is in electrical contact with the conduction channel 6, for example through said portion of the active layer 1a, this independent control allows a reduction in the transistor leakage current. This then allows an improvement in the performances of the transistor.

Moreover, and as will be explained in greater details later in reference to FIGS. 4 and 5, the invention, as compared to a gate that would have a "T" or a "L" shape, makes it possible for the behaviour of the transistor to be easily adapted without changing the geometry of these components (in particular, gate, channel, source and drain).

FIG. 3 shows a view according to section A-A in FIG. 2. This section is made at the head 4c of the hammer 4a, thus shows, on the one hand said portion of the active layer 1a along a transverse dimension I5 and the transverse portion of the gate along a transverse dimension I4, i.e. the head 4c of the hammer 4a. It should also be noted that the first portion 4c1 and the second portion 4c2 of the head 4c of the hammer 4a are shown in this figure.

In FIG. 3, said portion of the active layer 1a is arranged between two insulating trenches 7 or two portions of the same insulating trench 7 surrounding the active layer. It is surmounted by a layer of oxide 4e and a polycrystalline layer 4d, thus defining at least a portion of the gate 4 of the transistor. Preferably, this structure is found over the entire longitudinal extension of said portion of the active layer 1a and advantageously of the conduction channel 6.

It should be noted in this figure that the asymmetry of the head 4c4 of the hammer 4a is well illustrated with the transverse dimension I3 smaller than the transverse dimension I2. It should also be noted that the whole said portion of the active layer 1a is wrapped by the gate 4 in order to protect it from contamination problems during the various steps of the manufacturing method such as implants or deposits for example. As a matter of fact, the polycrystalline layer 4d of the gate 4 has a spatial extension so configured as to surround the oxide layer 4e of the gate 4 and thus have a larger spatial dimension than that of said portion of the active layer 1a, in particular I4 is very large in front of I5.

An alternative embodiment will now be described with reference to FIGS. 4 and 5.

Figure 4:
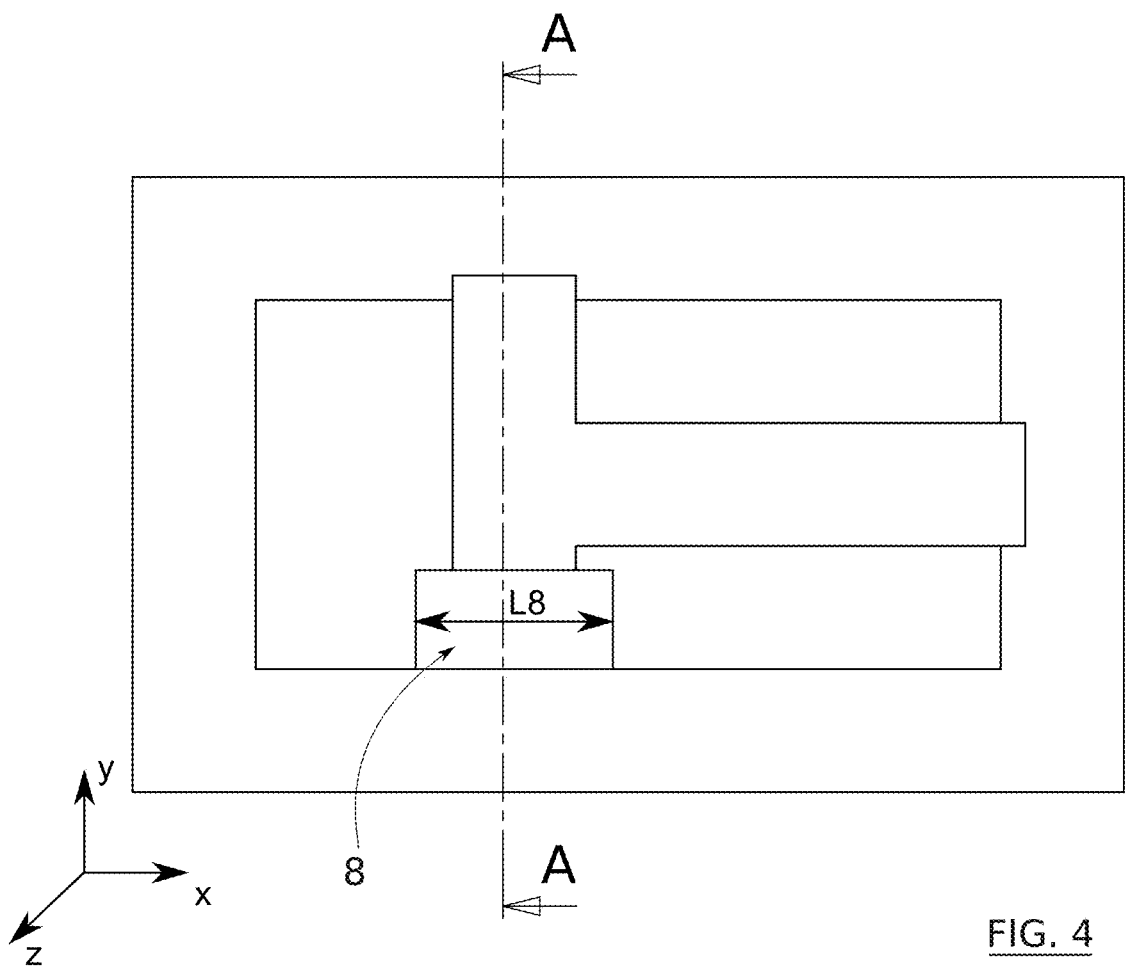
FIG. 4 illustrates a top view of a transistor in another embodiment of this invention, comprising a gate having a hammer shape and including an electrical connection between an electrical contact area and a source/drain area.

FIG. 4 shows a transistor according to one embodiment of the present invention wherein an electrical connection 8 is provided between the electrical contact area 3c and the drain area 3b. This electrical connection 8 makes it possible to connect the electrical potential of the conduction channel 6 to that of the drain area 3b so as to avoid the presence of an area with a floating electrical potential at the conduction channel 6.

Typically, this electrical connection 8 is made of a material with a conductive behaviour. For example, it is a metallic material or a semiconductor material doped in such a way as to exhibit a conductive behaviour.

Advantageously, since the electrical contact area 3c is electrically isolated from the drain area 3b by at least the second portion 4c2 of the head 4c of the hammer 4a and by at least one insulating trench 7a, the use of an electrical connection 8 is necessary to provide an electrical conduction between the electrical contact area 3c and the drain area 3b.

FIG. 5 is a view according to section A-A in FIG. 4. Here again, the asymmetry of the head 4c of the hammer 4a, which thus provides an area for establishing the electrical connection 8 between the electrical contact area 3c and the drain area 3b for example, should be noted. This electrical connection has a longitudinal dimension L8 being preferably greater than or equal to L2.

This electrical connection 8 can be made simply by depositing an electrically conductive material at least partially above the electrical contact area 3c and the drain area 3b. This electrical connection 8 overlies a portion of the source area 3a or drain area 3a and a portion of the area 3c. This electrical connection 8 overlies a portion 7a of the insulating trench 7, preferably over the insulating trench 7a.

Depending on one embodiment, the electrical connection 8 can be formed by ion implantation in the active layer as shown in dotted line by the area 3c'.

According to a preferred embodiment, the electrical connection 8 can be formed by ion implantation in the portion 7a of the insulating trench 7 as shown in dotted line by the area 3c'.

According to one embodiment not illustrated in the preceding figures, the perimeter, whether or not in its entirety, of the polycrystalline layer 4d of the gate 4, at least at the hammer 4a, may include spacers. These spacers cover the sides of the gate 4 so as to increase the physical-chemical protection of the oxide layer 4e of the gate, said portion of the active layer 1a and the conduction channel 6. They are made from silicon nitride, for example. This embodiment with spacers can be combined with each of the embodiments described above, in particular with those described in reference to FIGS. 2 to 5.

According to one embodiment, the present invention also relates to a method for manufacturing a transistor as presented above. This manufacturing method uses traditional micro and nanoelectronic techniques. In particular, this method uses the traditional steps of deposition, etching, doping, etc.

Thus, according to one embodiment, this method includes at least the following steps:

Supplying a, preferably SOI, substrate comprising on its surface at least one active layer 1, preferably made of monocrystalline silicon;

Defining a reception area intended to accommodate at least one transistor, preferably of the PDSOI type, via the formation of at least one insulating trench 7 and preferably via the formation of the portion 7a of the insulating trench 7;

Defining a conduction channel 6 at a part of the reception area;

Forming a gate 4, this step of forming a gate 4 comprising at least the following steps:

Forming and/or depositing an oxide, preferably a silicon oxide layer 4e, so as to cover the conduction channel 6;

Depositing a polycrystalline layer 4d over, and preferably around, said oxide layer 4e, so as to form the gate 4; This polycrystalline layer 4d comprises at least one polycrystalline material, preferably polycrystalline silicon. This polycrystalline layer 4d advantageously has the shape of a hammer 4a as described above, i.e. comprising a handle 4b and a head 4c.

Forming a source area 3a, for example by doping, on a first side of the handle 4b of the hammer 4a;

Forming a drain area 3b, for example by doping, on a second side of the handle 4b of the hammer 4a;

Forming an electrical contact area 3c, for example by doping; This electrical contact area 3c is so arranged that the head 4c of the hammer 4a is located between said electrical contact area 3c and the source 3a and drain 3b areas, and so that at least a part of the electrical contact area 3c has a so-called exposed portion facing one of the source area 3a and the drain area 3b and so that the portion 7a of the insulating trench 7 is disposed between the electrical contact area 3c and one of the source area 3a and the drain area 3b so that the electrical contact area 3c is electrically isolated from the source area 3a and the drain area 3b.

Optionally, forming an electrical connection 8 between the electrical contact area 3c and one of the source area 3a and the drain area 3b facing at least a portion of said electrical contact area 3c;

Optionally, forming spacers on one portion, and preferably on the whole, of the perimeter of the polycrystalline layer 4d, i.e. the hammer 4a.

The method thus presented, according to a non restrictive embodiment, does not increase the number of steps of the methods commonly used in the prior art.

The present invention makes it possible to have transistors the floating potential of the conduction channel of which can be controlled either independently of the source and drain areas or from the source area or the drain area. The shape of the gate allows a high adaptability to the type of transistor to be formed while presenting a high compactness so as to allow the production of circuits with high transistor density.

The present invention takes advantage of the shape of the polycrystalline layer of the gate so as to allow the formation of an electrical connection between the source or drain and the electrical contact area and to wrap the oxide layer of the gate so as to protect it as well as the conduction channel and said portion of the active layer located under the head of the hammer during, for example, the doping steps, generally carried out via ion implants.

As regards the transistor density that can be achieved through this gate shape, circuit design tests have surprisingly revealed a density of at least 120,000 gates per square millimetre. For comparison, the density for T-shaped gate structures is about 96,000 gates per square millimetre.

This invention, in addition to providing great design flexibility and adaptability, allows a significant increase in the density of transistors on the same substrate.

The invention is not limited to the embodiments previously described and extends to all the embodiments covered by the claims.

For example, in each of the embodiments described above, the source and drain areas can be perfectly reversed.

REFERENCES

1. Active layer
1a. Portion of the active layer below the hammer head
2. Insulating layer, BOX, silicon oxide
3a. Source area
3b. Drain area
3c. Electrical contact area
3c'. Electrical contact area formed only in the active layer
3c". Raised electrical contact area
4. Gate
4a. Hammer-shaped gate
4b. Hammer handle
4c. Hammer head
   4c1. First portion of the hammer head
   4c2. Second portion of the hammer head
4d. Polycrystalline layer
4e. Oxide layer
5a. First spacer
5b. Second spacer
6. Conduction channel
7. Insulating trenches, STI (Shallow Trench Insulation)
7a. Insulating trench separating the electrical contact area from the drain area
8. Electrical connection
L8. Longitudinal dimension of the electrical connection
Jc. Longitudinal dimension of the conduction channel
j1. Transverse dimension of the conduction channel
k1. Transverse dimension of the electrical contact area
k2. Transverse dimension of the electrical contact area facing at least one of the source and drain areas
Lg. Longitudinal dimension of the gate
L1. Longitudinal dimension of the longitudinal portion of the gate (of the hammer handle)
L2. Longitudinal dimension of the transverse portion of the gate (from the hammer head)
I1. Transverse dimension of the longitudinal portion of the gate (of the hammer handle)
I2. First extension dimension of the first portion extending transversely beyond the first side of said portion of the active layer
I3. Second extension dimension of the first portion extending transversely beyond the first side of said portion of the active layer
I4. Transverse dimension of the transverse portion of the gate (from the hammer head)
I5. Transverse dimension of said portion of the active layer located below the transverse portion of the gate

The invention claimed is:

1. A transistor carried by at least one substrate comprising at least one active layer based on at least one semiconductor material, the transistor comprising:
  a) at least one source area and at least one drain area;
  b) at least one electrical contact area;
  c) at least one conduction channel:
    i) located between the source area and the drain area;
    ii) extending from said source area to said drain area in a transverse dimension j1 and extending in a longitudinal dimension Jc;
  d) at least one gate completely overlying said conduction channel, wherein said gate comprises:
    (1) a longitudinal portion extending longitudinally from at least each of the source and drain areas, above the conduction channel, and at least to the electrical contact area;
    (2) a transverse portion located between the electrical contact area and each of the source and drain areas and extending transversely on either side of a portion of the active layer on a transverse dimension I4, and the transverse portion comprising:
      (a) at least a first portion extending transversely beyond a first side of said portion of the active layer on a first extension dimension I2, the first portion being shaped to be disposed between a portion of the electrical contact area and a first area taken from the source area or the drain area so as to avoid any electrical connection between the electrical contact area and said first area;
      (b) at least a second portion extending transversely beyond a second side of said portion of the active layer, opposite said first side, on a second extension dimension I3;
and in that: I2>I3 with I3≠0,
and in that the electrical contact area is located at a distance from the source area and the drain area so as to avoid any electrical connection between the electrical contact area and a second area being the other area taken among the source area or the drain area, the second area being which is disposed opposite the electrical contact area,
and wherein an insulating trench is interposed between the electrical contact area and said second area being the other area taken among the source area or the drain area, the insulating trench extending to the substrate.

2. The transistor according to claim 1, wherein I2 is greater than 1.2 times I3.

3. The transistor according to claim 1, wherein said portion of the active layer located below the transverse portion of the gate has a transverse dimension I5, I5 being less than I4 and greater than j1.

4. The transistor according to claim 1, wherein said transverse portion is shaped such that an area of the substrate is not covered by said gate and is located between said electrical contact area and said second area, said not covered area having a transverse dimension k2.

5. The transistor according to claim 1, wherein the electrical contact area is electrically isolated from said second area by at least one insulating trench.

6. The transistor according to claim 1, comprising at least one electrical connection located between at least a portion of the electrical contact area and said second area.

7. The transistor according to claim 6, wherein the electrical connection has a transverse dimension less than or equal to k2.

8. The transistor according to claim 6, wherein the electrical connection has a longitudinal dimension L8 greater than or equal to a longitudinal dimension L2 of the transverse portion of the gate.

9. The transistor according to claim 1, wherein said longitudinal portion of the gate has a transverse dimension I1 and wherein the ratio I1/j1 is greater than 1.

10. The transistor according to claim 1, wherein the longitudinal portion of the gate has a transverse dimension I1 and wherein the ratio I4/I1 is greater than 2, and wherein the ratio I4/j1 is greater than 2.

11. The transistor according to claim 1, wherein the ratio I2/I3 is greater than 2.

12. The transistor according to claim 4, wherein the ratio I2/k2 is greater than 1.

13. The transistor according to claim 1, wherein the gate has a longitudinal dimension Lg, the ratio Lg/Jc being greater than or equal to 1.

14. The transistor according to claim 1, wherein the gate comprises at least one oxide layer overlying at least the conduction channel and at least one polycrystalline layer overlying and partially surrounding at least said oxide layer.

15. The microelectronic device comprising a plurality of transistors according to claim 1.

16. A transistor carried by at least one substrate comprising at least one active layer based on at least one semiconductor material, the transistor comprising:
   a) at least one source area and at least one drain area;
   b) at least one electrical contact area;
   c) at least one conduction channel:
      i) located between the source area and the drain area;
      ii) extending from said source area to said drain area in a transverse dimension j1 and extending in a longitudinal dimension Jc;
   d) at least one gate completely overlying said conduction channel, wherein said gate comprises:
      (1) a longitudinal portion extending longitudinally from at least each of the source and drain areas, above the conduction channel, and at least to the electrical contact area;
      (2) a transverse portion located between the electrical contact area and each of the source and drain areas and extending transversely on either side of a portion of the active layer on a transverse dimension I4, and the transverse portion comprising:
         (a) at least a first portion extending transversely beyond a first side of said portion of the active layer on a first extension dimension I2, the first portion being shaped to be disposed between a portion of the electrical contact area and a first area taken from the source area or the drain area so as to avoid any electrical connection between the electrical contact area and said first area;
         (b) at least a second portion extending transversely beyond a second side of said portion of the active layer, opposite said first side, on a second extension dimension I3;
   and in that: I2>I3 with I3≠0,
   and in that the electrical contact area is located at a distance from the source area and the drain area so as to avoid any electrical connection between the electrical contact area and a second area being the other area taken among the source area or the drain area, the second area being which is disposed opposite the electrical contact area,
   and wherein an insulating trench is interposed between the electrical contact area and said second area being the other area taken among the source area or the drain area, and a bottommost portion of the insulating trench is above an uppermost portion of the substrate.

17. A transistor carried by at least one substrate comprising at least one active layer based on at least one semiconductor material, the transistor comprising:
   a) at least one source area and at least one drain area;
   b) at least one electrical contact area;
   c) at least one conduction channel:
      i) located between the source area and the drain area;
      ii) extending from said source area to said drain area in a transverse dimension j1 and extending in a longitudinal dimension Jc;
   d) at least one gate completely overlying said conduction channel, wherein said gate comprises:
      (1) a longitudinal portion extending longitudinally from at least each of the source and drain areas, above the conduction channel, and at least to the electrical contact area, wherein the longitudinal portion extends in a first axis;
      (2) a transverse portion located between the electrical contact area and each of the source and drain areas and extending transversely on either side of a portion of the active layer on a transverse dimension I4, wherein the transverse portion extends in a second axis, the second axis being orthogonal to the first axis, and the transverse portion comprising:
         (a) at least a first portion extending transversely beyond a first side of said portion of the active layer on a first extension dimension I2, wherein the first portion extends in the second axis beyond an extension in the second axis of the electoral contact area and of the source area or the drain area regarding a first direction of extension, the first portion being shaped to be disposed between a portion of the electrical contact area and a first area taken from the source area or the drain area so as to avoid any electrical connection between the electrical contact area and said first area;
         (b) at least a second portion extending transversely beyond a second axis of said portion of the active layer, opposite said first side, on a second extension dimension I3, wherein the second portion extends in the second axis in a second direction of extension opposite to the first direction of extension;
   and in that: I2>I3 with I3≠0,
   and in that the electrical contact area is located at a distance from the source area and the drain area so as to avoid any electrical connection between the electrical contact area and a second area being the other area taken among the source area or the drain area, the second area being which is disposed opposite the electrical contact area, and wherein the electrical contact area extends in the second axis beyond the extension in the second axis of the second portion regarding the second direction of extension,
   and wherein an insulating trench is interposed between the electrical contact area and said second area being the other area taken among the source area or the drain area, the insulating trench extending to the substrate,
   and wherein the source area or the drain area extends in the second axis beyond the extension in the second axis of the second portion regarding the second direction of extension.

* * * * *